(12) United States Patent
Wagner et al.

(10) Patent No.: US 10,682,773 B2
(45) Date of Patent: Jun. 16, 2020

(54) COOLING DEVICE AND ROBOT CONTROL DEVICE HAVING A COOLING DEVICE

(71) Applicant: KUKA Deutschland GmbH, Augsburg (DE)

(72) Inventors: Michael Wagner, Untermeitingen (DE); Gerhard Werner, Augsburg (DE); Mario Selic, Augsburg (DE)

(73) Assignee: KUKA Deutschland GmbH, Augsburg (DE)

( * ) Notice: Subject to any disclaimer, the term of this patent is extended or adjusted under 35 U.S.C. 154(b) by 0 days.

(21) Appl. No.: 16/481,947

(22) PCT Filed: Jan. 22, 2018

(86) PCT No.: PCT/EP2018/051419
§ 371 (c)(1),
(2) Date: Jul. 30, 2019

(87) PCT Pub. No.: WO2018/138041
PCT Pub. Date: Aug. 2, 2018

(65) Prior Publication Data
US 2020/0039095 A1    Feb. 6, 2020

(30) Foreign Application Priority Data

Jan. 30, 2017 (DE) .................. 10 2017 201 410

(51) Int. Cl.
*B25J 19/00* (2006.01)
*H05K 7/20* (2006.01)
(Continued)

(52) U.S. Cl.
CPC ........ *B25J 19/0054* (2013.01); *H01L 23/467* (2013.01); *H05K 1/0203* (2013.01);
(Continued)

(58) Field of Classification Search
None
See application file for complete search history.

(56) References Cited

U.S. PATENT DOCUMENTS 5,424,915 A    6/1995  Katooka et al.
6,353,536 B1 * 3/2002  Nakamura ............ G06F 1/1632
                                                    361/679.41
(Continued)

FOREIGN PATENT DOCUMENTS

DE    102007057472 A1    6/2008
DE    202008012988 U1    12/2008
(Continued)

OTHER PUBLICATIONS

European Patent Office; Search Report and Written Opinion in related International Patent Application No. PCT/EP2018/051419 dated Mar. 28, 2018; 12 pages.

*Primary Examiner* — Robert J Hoffberg
(74) *Attorney, Agent, or Firm* — Dorton & Willis, LLP

(57) ABSTRACT

A cooling device for cooling electrical components of a robot control device with cooling air flow generated by a fan having a first receiving space for first electrical components, a second receiving space for second electrical components, and a cooling body wall fluidically separating the first receiving space from the second receiving space. The cooling body wall has a first separating wall surface facing the first receiving space and an opposite second separating wall surface facing an intermediate space of the cooling body wall. The second separating wall surface includes cooling wall projections that form at least one flow channel. The cooling body wall has a cooling air passage opening that is designed to convey a cooling air flow conveyed by at least one fan of the cooling device from the first receiving space, through the cooling body wall, into the intermediate space.

13 Claims, 5 Drawing Sheets

(51) Int. Cl.
*H05K 5/02* (2006.01)
*H01L 23/467* (2006.01)
*H05K 1/02* (2006.01)

(52) U.S. Cl.
CPC ......... *H05K 5/0217* (2013.01); *H05K 7/2039* (2013.01); *H05K 7/20145* (2013.01); *H05K 7/20918* (2013.01)

(56) References Cited

U.S. PATENT DOCUMENTS

| | | | | |
|---|---|---|---|---|
| 7,843,685 B2 * | 11/2010 | Beauchamp | ............. | G06F 1/20 312/223.2 |
| 2008/0144279 A1 | 6/2008 | Yamamoto et al. | | |
| 2012/0050990 A1 | 3/2012 | Kaslusky | | |

FOREIGN PATENT DOCUMENTS

| | | |
|---|---|---|
| DE | 102008062430 A1 | 7/2010 |
| EP | 2797396 A2 | 10/2014 |
| EP | 2879475 A1 | 6/2015 |

\* cited by examiner

COOLING DEVICE AND ROBOT CONTROL DEVICE HAVING A COOLING DEVICE

CROSS-REFERENCE TO RELATED APPLICATIONS

This application is a national phase application under 35 U.S.C. § 371 of International Patent Application No. PCT/EP2018/051419, filed Jan. 22, 2018 (pending), which claims the benefit of priority to German Patent Application No. DE 10 2017 201 410.5, filed Jan. 30, 2017, the disclosures of which are incorporated by reference herein in their entirety.

TECHNICAL FIELD

The invention relates to a cooling device for cooling electrical components of a robot control device by means of a cooling air flow generated by a fan. The invention also relates to a robot control device with a cooling device of this kind.

BACKGROUND

DE 10 2008 062 430 A1 discloses a control cabinet, in particular for industrial robots, comprising a receiving space for an assembly housing, and other control components and/or control assemblies, a ventilation space, an intermediate wall separating the receiving space from the ventilation space, a heat exchanger arranged in the ventilation space, the first cooling structures of which are associated to the inner circuit of the receiving space and the second cooling structures of which are associated to the outer circuit of the ventilation space, wherein an inner circulation air flow is generated by a fan integrated in an assembly housing, in particular in a control computer housing.

SUMMARY

The object of the invention is to provide a cooling device for cooling electrical components of a robot control device, and a robot control device having a cooling device of this kind, which allows, in a compact manner, a particularly effective heat dissipation from electrical components of a robot control device.

This object is achieved according to the invention by a cooling device for cooling electrical components of a robot control device by means of a cooling air flow generated by a fan, having a first receiving space for first electrical components, a second receiving space for second electrical components and a cooling body wall fluidically separating the first receiving space from the second receiving space, which cooling body wall has a first separating wall surface facing the first receiving space and an opposite second separating wall surface facing an intermediate space of the cooling body wall, which second separating wall surface is provided with cooling wall projections that form at least one flow channel, and which cooling body wall has a cooling air passage opening that is designed to convey a cooling air flow conveyed by at least one fan of the cooling device from the first receiving space through the cooling body wall and into the intermediate space.

In any case, a cooling device according to the invention comprises at least one fan, which forms a conveying device for setting air in motion, and a cooling body, which is formed such that the heat generated in an electrical or electronic part of an electrical or electronic component, in particular in the form of an energy loss, is removed by thermal conduction from the component, is absorbed in the cooling body and is distributed within the cooling body, which is made of a material having good thermal conduction properties, and cooling wall projections, in particular integrally formed with the cooling body, and which are formed such as to release the heat absorbed by the part in the cooling body into the environment again, i.e. into the air, in particular by convection.

The electrical components may be electrical and/or electronic components. The respective component may in particular comprise electronic semiconductor components, which may be, for example, power semiconductors, such as, for example, power diodes, thyristors, triacs, or power MOSFETs and IGBT components, or similar power transistors. The electronic semiconductor device may also be a microprocessor, such as a CPU or a graphics processor of a digital computer. The electrical and/or electronic component itself may be, for example, a drive amplifier or an electronic circuit board.

The respective receiving space forms within a housing a place in which the respective required electrical and/or electronic components are arranged.

Thus, for example, the first receiving space can be provided to receive the electrical and/or electronic components which are provided to supply the motors of a robot arm with electrical energy for moving the joints of the robot arm and thus drive the motors, so that the joints of the robot arm can be moved automatically under the control of a robot program or can be manually controlled in a manual drive mode of operation. Thus, the first receiving space can form a low voltage region for the power electronics.

The second receiving space may be provided for receiving the electrical and/or electronic components intended to form the control hardware of the robot controller. Accordingly, the second receiving space may, for example, form a motherboard of a computer on which the control software of the robot is executable. Thus, the second receiving space can form a protective extra-low voltage region for the control electronics.

The cooling body wall is made of a material which has good, in particular very good thermal conduction properties, so that the heat introduced into the cooling body wall can be distributed as quickly as possible by thermal conduction and transported to the cooling wall projections, so that the cooling wall projections can transfer the heat to the environment, i.e. to the air. The cooling body wall thus forms a special cooling body, which, on the one hand, has all the essential properties of known cooling bodies and thus consists of a material having good thermal conduction properties, which has the largest possible surface and, due to the arrangement of cooling wall projections, facilitates or promotes a convection air flow, while forming, on the other hand, a mechanical separating wall or barrier, in order to at least fluidically separate the first receiving space from the second receiving space. By way of example, the cooling body wall may also be designed to electrically separate the first receiving space from the second receiving space. The cooling body wall may accordingly preferably be made of the known materials aluminum or copper. However, other materials, such as alloys are conceivable, which have correspondingly high thermal conductivities, such as aluminum or copper. The alloys may, for example, also contain aluminum and/or copper.

Due to the inventive feature that the cooling body wall in addition to providing thermal conduction also forms a (mechanical) separating wall that separates the first receiving space from the second receiving space, the cooling body wall has a first separating wall surface facing the first receiving space and a second separating wall surface facing the second receiving space. The cooling body wall separates the first receiving space from the second receiving space at least fluidically. This means that an air flow (passive air flow) caused by convection or a forced air flow generated by a fan (active air flow) in the first receiving space may occur at least largely or completely uninfluenced, for example, by an air flow caused by convection (passive air flow) or by a forced air flow generated by a fan (active air flow) occurring in the second receiving space. The cooling body wall can thus separate the first receiving space, for example, in an airtight manner from the second receiving space. However, a sufficient fluidic separation is already present when the cooling body wall does not provide a completely airtight separation of the first receiving space from the second receiving space, by leaving only small air gaps or passages, which allow a leakage air flow, which is however so low that the respective desired air flow in the first receiving space or second receiving space is not significantly disturbed or changed.

The cooling wall projections serve to increase the surface of the cooling body wall in order to achieve a better heat dissipation to the air of the environment. In a first general embodiment, the cooling wall projections can be composed of flat cooling ribs, rising, i.e. projecting, in particular vertically, from the cooling body wall. The cooling ribs can also form additional channel walls of the at least one flow channel. In a second general embodiment, however, the cooling wall projections can also only be formed by a plurality of cooling domes, cooling fingers or cooling pins, which rise, i.e. project, in particular perpendicularly, from the cooling body wall. The cooling wall projections of both embodiments may be arranged on the cooling body wall such that two adjacent cooling ribs or two adjacent rows of cooling domes, cooling fingers or cooling pins form an air flow channel.

The inventive intermediate space is formed by the flow channels delimited by the cooling wall projections. The intermediate space is formed insofar on the cooling body wall. The intermediate space is accordingly arranged in a separating manner between the first receiving space and the second receiving space.

By means of the inventive cooling body wall, a cooling device is provided in which first electrical components and second electrical components are arranged separately from each other in separated receiving spaces and the cooling body wall forms a separating wall which separates the separated components at least fluidically from another. Further separating properties can be achieved by the cooling body wall according to the invention, in particular an electrical separation, in particular into a low voltage region for the power electronics and a protective extra-low voltage region for the control electronics, but also, for example, a separation with regard to electromagnetic compatibility (EMC) or noise.

The cooling device may comprise a first fan, which is arranged on the cooling air passage opening and is designed such that the first fan draws the cooling air from the first receiving space and discharges it into the intermediate space.

The first fan may be formed as a first radial fan, which is arranged such that the first radial fan draws the cooling air from the first receiving space in the axial direction and discharges it in the radial direction into the intermediate space.

The first fan, in particular the first radial fan, may comprise at least one fan rotor and an electric motor driving the fan rotor.

The cooling air passage opening can be arranged in the region of a first end portion of the cooling body wall, the cooling wall projections form at least a first flow channel, which comprises a first inflow channel portion originating from the passage opening and leading to a second end portion of the cooling body wall opposite the first end portion of the cooling body wall and a first return flow channel portion originating from the second end portion of the cooling body wall and returning the flow to the first end portion of the cooling body wall, wherein a first exhaust opening is arranged on the first end portion, through which the cooling air exits the intermediate space.

Accordingly, a first flow channel or a plurality of first flow channels is connected to the cooling air passage opening in the flow direction, wherein each flow channel has an inflow channel portion which leads the air at least approximately over the entire width or entire height of the cooling body wall in a direction, wherein the respective flow channel at the end of the inflow channel portion has a recirculating channel portion, which may for example be U-shaped, which is designed to direct the air from the end of the inflow channel portion to the beginning of the return flow channel portion. The return flow channel portion, in turn, returns the air at least approximately over the entire width or height of the cooling body wall in the opposite direction, where the air has thus passed the width or the height of the cooling body wall twice (once through the inflow channel portion and once through the return flow channel portion), and then exits the intermediate space in the flow direction. Two or more flow channels may be arranged parallel to each other. A common cooling rib may be a common side wall of two adjacent flow channels. Each flow channel can be designed in a U-shape. A plurality of U-shaped flow channels can be arranged nested into each other so that the plurality of U-shaped flow channels are arranged parallel to one another.

The cooling device can generally have a first lid connected to the cooling body wall and arranged on the side of the second separating wall surface of the cooling body wall, which lid is designed to cover the cooling wall projections forming at least one flow channel, such that the at least one flow channel is enclosed in a fluidically delimiting way both by the second separating wall surface and by the cooling wall projections and the first lid.

The lid can thus be attached to the cooling body wall and/or to the cooling wall projections, for example in an airtight manner. However, a sufficient fluidic separation is already given, if the lid is not resting in an absolutely airtight manner on the cooling body wall and/or on the cooling wall projections, while leaving only small air gaps or passages, which allow a leakage air flow, which is however so low that the respective desired air flow in the flow channels is not significantly disturbed or changed.

The first lid may have a recess which is designed to convey a cooling air flow conveyed by at least one fan of the cooling device out of the second receiving space through the first lid and further into the intermediate space.

The recess may be an open-edged recess on an edge portion of the lid. Alternatively, however, the recess may also be formed as a closed contoured window or a hole distant from the edge in the lid.

The cooling device may comprise a second fan, which is arranged in the region of the recess of the first lid and is designed such that the second fan draws the cooling air from the second receiving space and discharges the same into the intermediate space.

The second fan may be formed as a second radial fan, which is arranged such that the second radial fan draws the cooling air from the second receiving space in the axial direction and discharges it in the radial direction into the intermediate space.

The second fan, in particular the second radial fan may comprise at least one fan rotor and an electric motor driving the fan rotor.

The recess of the first lid can be arranged in the region of the first end portion of the cooling body wall, the cooling wall projections can form at least one second flow channel, which comprises a second inflow channel portion originating from the recess of the first lid and which leads to a second end portion of the cooling body wall opposite the first end portion of the cooling body wall and a second return flow portion originating from the second end portion of the cooling body wall and which returns the flow to the first end portion of the cooling body wall, at which first end portion a second exhaust opening is arranged, through which the cooling air exits the intermediate space.

Accordingly, a second flow channel or a plurality of second flow channels are connected to the recess in the direction of flow, wherein each flow channel is provided with an inflow channel portion, which leads the air at least approximately over the entire width or entire height of the cooling body wall in a direction, wherein the respective flow channel at the end of the inflow channel portion has a recirculating channel portion, which may for example be U-shaped, which is designed to direct the air from the end of the inflow channel portion to the beginning of the return flow channel portion. The return flow channel portion, in turn, returns the air at least approximately over the entire width or height of the cooling body wall in the opposite direction, where the air has thus passed the width or the height of the cooling body wall twice (once through the inflow channel portion and once through the return flow channel portion), and then exits the intermediate space in the flow direction. Two or more flow channels may be arranged parallel to each other. A common cooling rib may be a common side wall of two adjacent flow channels. Each flow channel can be designed in a U-shape. A plurality of U-shaped flow channels can be arranged nested into each other so that the plurality of U-shaped flow channels are arranged parallel to one another.

The second flow channels can be arranged on the cooling body wall in particular mirror-symmetrically with respect to the first flow channels.

The first separating wall surface of the cooling body wall facing the first receiving space may comprise fastening domes which are designed to fasten at least one electrical component, which electrical component comprises at least one power semiconductor component, wherein the fastening domes are designed such that in the attached state of the electrical component the at least one power semiconductor component rests against the first separating wall surface of the cooling body wall for thermal transfer.

In all embodiments, the cooling body wall can be designed as an integral die-cast cooling body. The cooling body wall is made of a material having good, in particular very good thermal conduction properties, so that the heat introduced into the cooling body wall can be distributed as quickly as possible by thermal conduction and transported to the cooling wall projections, so that the cooling wall projections can release heat into the environment, i.e. to the air.

The cooling body wall thus forms a special cooling body, which, on the one hand, has all the essential properties of known cooling bodies and thus consists of a material having good thermal conduction properties, which has the largest possible surface and, due to the arrangement of cooling wall projections, facilitates or promotes a convection air flow, while forming, on the other hand, a mechanical separating wall or barrier, in order to at least fluidically separate the first receiving space from the second receiving space. By way of example, the cooling body wall may also be designed to electrically separate the first receiving space from the second receiving space. The cooling body wall may accordingly preferably be made of the known materials aluminum or copper. However, other materials, such as alloys are conceivable, which have correspondingly high thermal conductivities, such as aluminum or copper. The alloys may, for example, also contain aluminum and/or copper.

The cooling body wall may be formed as an integral die-cast cooling body together with the enveloping delimiting side wall forming a housing outer wall of a housing of a robot control device, as described in the previous paragraph.

In all embodiments, the cooling body wall may accordingly comprise an enveloping delimiting side wall enclosing the cooling body wall like a frame, which extends at least substantially perpendicularly to the plane of the cooling body wall and which is designed to form a housing outer wall of a housing of a robot control device.

The enveloping delimiting side wall of the cooling body wall may accordingly form four side walls of a housing of the robot control device. In addition, the remaining two sides of the housing, which in particular form a front side and a rear side of the housing, can each be closed by a separate housing lid. Each housing lid can be fastened directly to the cooling body wall by means of releasable fastening means, for example by screwing. For this purpose, the cooling body wall can comprise corresponding threaded holes, into which screws can be screwed, which releasably fasten the separate housing lid to the cooling body wall in order to form a completely closed housing of the robot control device together with the enveloping delimiting side wall, which is preferably formed integrally with the cooling body wall.

The object of the invention is also achieved by a robot control device having a cooling device according to one or more of the described embodiments.

In a robot control device, it is not only necessary to cool the power electronics, such as in particular the power electronics of drive amplifiers for the motors of the robot, but also the remaining electronic components, such as in particular general control boards, such as PC boards. Although this can be achieved by the use of separate cooling systems, a combined solution for cooling the entire robot control device may be advantageous, for example, in order to save space and costs. In addition, the structure of the housing of the robot control device, and the electrical and/or mechanical connection of the individual electronic component, such as printed circuit boards, can be designed in the robot control device in order to have a cost efficient and time efficient assembly.

With the cooling device according to the invention, the cooling of the power modules, in particular of the drive amplifiers, which are mounted on the cooling body, i.e. on the cooling body wall, is as follows.

In order to obtain a space-saving cooling solution, a cooling body, i.e. a cooling body wall, is proposed, which is supplied by, for example, two internal radial fans with air. In this case, one of the two fans can be mounted rotated by 180 degrees, so that the suction opening is facing the cooling body. At this suction point, a hole, in particular a round hole can be formed on the cooling body, i.e. on the cooling body wall. This allows air to be drawn in from both sides of the cooling body. The built-in radial fans allow a flat design of the cooling body due to their flat design in the air outlet direction, in particular, as well as due to the property of providing high pressure differences. In order to guide the air flow along the cooling wall projections of the cooling body, for example, a sheet or lid may be mounted on the side of the cooling wall projections. The air flow can be conducted in the cooling body so that it exits at an end portion of the cooling body or cooling body wall, such as an upper side of the cooling body. As a result, a defined air flow is ensured at each point of the cooling body.

With the cooling device according to the invention, the fastening of the components to the cooling body wall can be carried out as follows.

A sheet, i.e. a lid, for ensuring the air flow through the cooling channels delimited by the cooling wall projections, can be mounted directly on the cooling body or directly above the cooling body, i.e. the cooling body wall. Additional holding domes which, for example, in the case of a cooling body wall produced by die casting from aluminum, can also be molded directly onto the cooling body wall, serve for fastening the electrical and/or electronic components, such as the electronic components in the protected extra-low voltage region.

For example, the power modules of the inverters or the drive amplifiers are screwed directly on the opposite side of the cooling body, i.e. the cooling body wall. As a result, the main power loss of the robot control device can be introduced directly into the cooling body wall, which is flown through by air. Aluminum domes, which can be formed on the cooling body by the die-casting process, can serve as screwing points, for example, for an inverter circuit board. Further components, which are necessary, for example, for controlling the power semiconductors, can be connected directly to the inverter board via standoffs and (board-to-board) plug connectors. Such a distribution of the components on the two sides of the cooling body, i.e. the cooling body wall, not only ensures a generally slim and stable fastening of the components, but also the spatial separation of the power electronics forming in particular a low voltage region and the control electronics, forming in particular a protected extra-low voltage region. Thus, the cooling body, i.e. the cooling body wall not only has a cooling function but also an electrical contact protection between the low voltage region of the inverters and the protected extra-low voltage region of the control PCs, as well as a shielding function for the control PCs with respect to electrical and magnetic fields originating from the power section.

With the cooling device according to the invention a cooling of other electrical components, which are not mounted on the cooling body, may take place as follows.

In addition to the slim cooling body design, it becomes possible, especially through the use of radial fans, to also cool those electrical or electronic components which are not in contact with the cooling body for thermal transfer, such as the power modules. To this end, a recess corresponding to the suction opening of the radial fan in the cooling body is milled in the first receiving space containing the inverter.

In addition, ventilation slots can be introduced as a fresh air inlet in a connector panel, which is arranged, for example, on a lower side of the housing of the robot control device. The ventilation slots allow an air flow from the connector panel at the bottom of the robotic control device across the components in the first receiving space to the radial fan. As a result, these components can be cooled with cold fresh air. The then preheated air is then passed through the cooling body, i.e. passed through the cooling body wall and exits at the side opposite the connector panel of the fresh air inlet side of the housing, i.e. out of the robot control device again into the open environment. The fresh air inlet can in particular be formed on a lower side of the housing of the robot control device and the outlet can be formed on the opposite upper side. This is advantageous because this arrangement corresponds to the natural convection, which should not be inhibited in switch cabinets, control cabinets and PC housings in which the robot control can be installed. The cooling of the control PC part then functions identically by means of a second radial fan, which draws the air from the opposite side of the cooling body.

Another advantage of this cooling concept with internal cooling body, i.e. internal cooling body wall, is a greatly reduced weight, due to a narrow and double-sided construction.

If the cooling device according to the invention is manufactured in a die-casting process, in particular an aluminum die-casting process, it is expedient to provide a demolding angle of, for example, approximately 1.5° in the demolding direction. This angle is necessary in order to be able to extract the molding tool during the demolding process after the solidification of the casting, in particular of aluminum, without problems. This means that the wall thickness of the die-cast increases with the height in the direction of demolding. Thus, a heightening of the housing in the direction of demolding affects the weight of the housing not in a linear manner, but according to the square. In this case, the slender design of the cooling wall projections has a particularly positive effect on the cost and weight of the housing. In addition, due to the internal cooling body surface, a nearly symmetrical demolding is ensured. The wall thickness at the thickest point can thus be significantly reduced.

A concrete exemplary embodiment of the invention is explained in more detail in the following description of the figures with reference to the accompanying figures. Concrete features of this exemplary embodiment, irrespective of the specific context in which they are mentioned, may also represent, if appropriate, individually or in other combinations, general features of the invention.

BRIEF DESCRIPTION OF THE DRAWINGS

The accompanying drawings, which are incorporated in and constitute a part of this specification, illustrate exemplary embodiments of the invention and, together with a general description of the invention given above, and the detailed description given below, serve to explain the principles of the invention.

DETAILED DESCRIPTION

Figure 1:
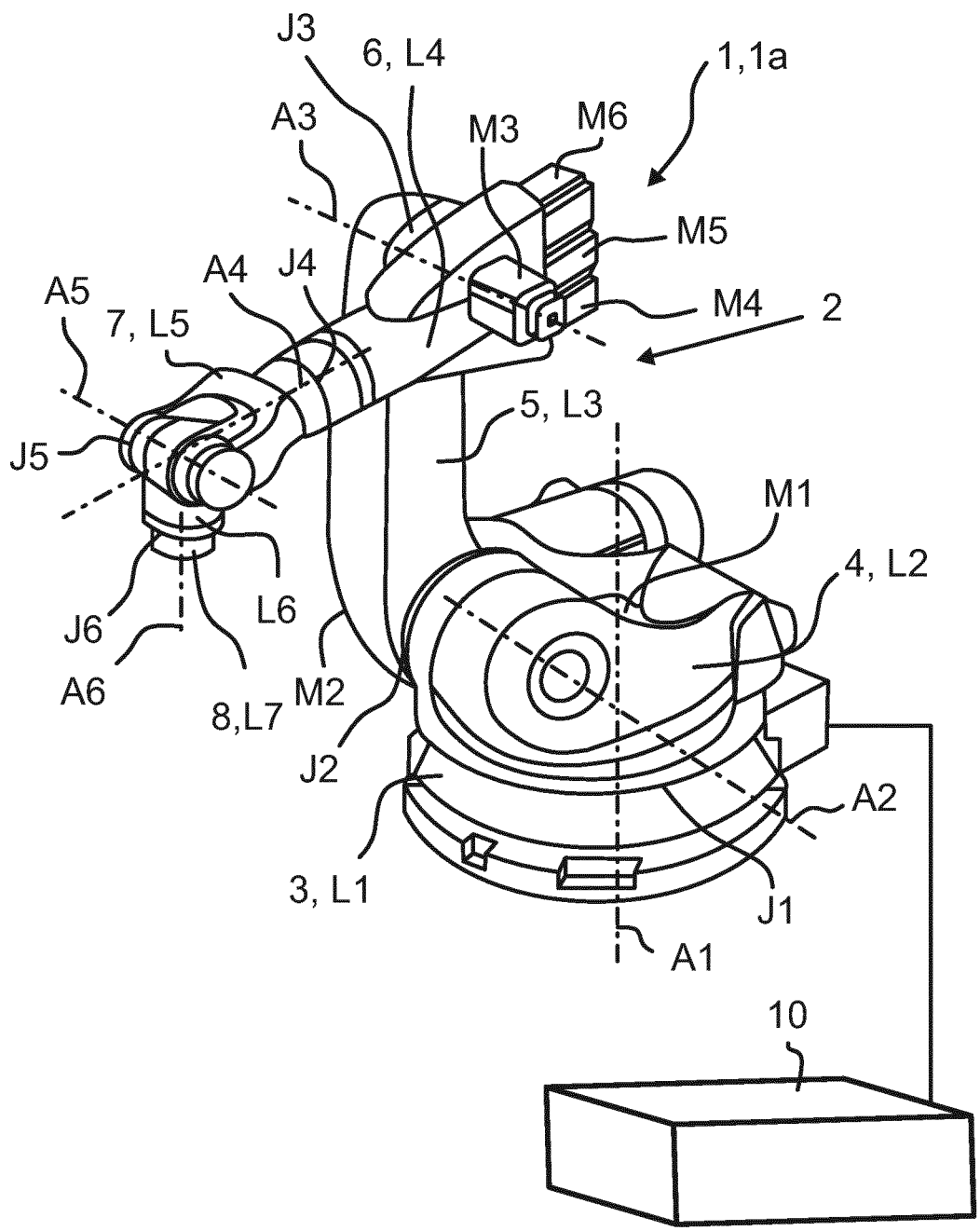
FIG. 1 is a perspective view of an exemplary industrial robot of the type of a six-axis articulated robot comprising a robot control device according to the invention.

FIG. 1 shows a robot 1 in the exemplary design of a six-axis articulated robot 1a, which comprises a robot arm 2 and a robot control device 10. In the case of the present exemplary embodiment, the robot arm 2 comprises a plurality of links L1 to L7, which are arranged one after the other and which are connected to each other in a rotatable manner by means of joints J1 to J6.

The robot control device 10 of the robot 1 is configured or designed to execute a robot program, by which the joints J1 to J6 of the robot arm 2 can be adjusted or rotated in an automated manner according to the robot program or manually with a manual operation. For this purpose, the robot control device 10 is connected to controllable electrical motors M1 to M6 of the robot 1, which are designed to move the joints J1 to J6 of the robot 1.

In the case of the present exemplary embodiment of an industrial robot 1a, the links L1 to L7 are composed of a frame 3 and a carousel 4, which is rotatably mounted relative to the frame 3 about a vertically extending axis A1. Further links of the robot arm 2 are a link arm 5, an arm boom 6 and a preferably multi-axis robot hand 7 having a fastening device designed as a tool flange 8 for fastening, for example, a robot gripper. The link arm 5 is rotatably mounted about a preferably horizontal axis of rotation A2 at the lower end, i.e. at the joint J2 of the link arm 5 on the carousel 4.

At the upper end of the link arm 5, the link arm 5 is in turn pivotally mounted about a preferably horizontal axis A3 on the first joint J3 of the arm boom 6. This carries at the end the robot hand 7 with its preferably three axes of rotation A4, A5, A6. The joints J1 to J6 are driven by programmable control by one of the electric motors M1 to M6 via the robot control device 10. In general, a transmission can be provided between each of the links L1 to L7 and the respectively associated electric motors M1 to M6.

In the case of the present exemplary embodiment, the robot control device 10 comprises a cooling device 11 according to the invention.

The cooling device 11 according to FIGS. 2 to 5 is designed for cooling electrical components of the robot control device 10. For this purpose, the cooling device 11 comprises, in the case of the present exemplary embodiment, a first fan 12.1 and a second fan 12.2, both of which each generate a cooling air flow. The cooling device 11 comprises a first receiving space 13.1 for first electrical components 14.1 and a second receiving space 13.2 for second electrical components 14.2. The cooling device 11 according to the invention comprises a cooling body wall 15, which fluidically separates the first receiving space 13.1 from the second receiving space 13.2, which wall comprises a first separating wall surface 16.1 facing the first receiving space 13.1 and a second opposite separating wall surface 16.2, facing an intermediate space 13.3 of the cooling body wall 15, which is provided with cooling wall projections 18 forming at least one flow channel 17.1, 17.2. The cooling body wall 15 also comprises a cooling air passage opening 19 (FIG. 2) which is designed to convey a cooling air flow conveyed by the first fan 12.1 of the cooling device 11 out of the first receiving space 13.1 through the cooling body wall 15 and into the intermediate space 13.3.

Figure 2:
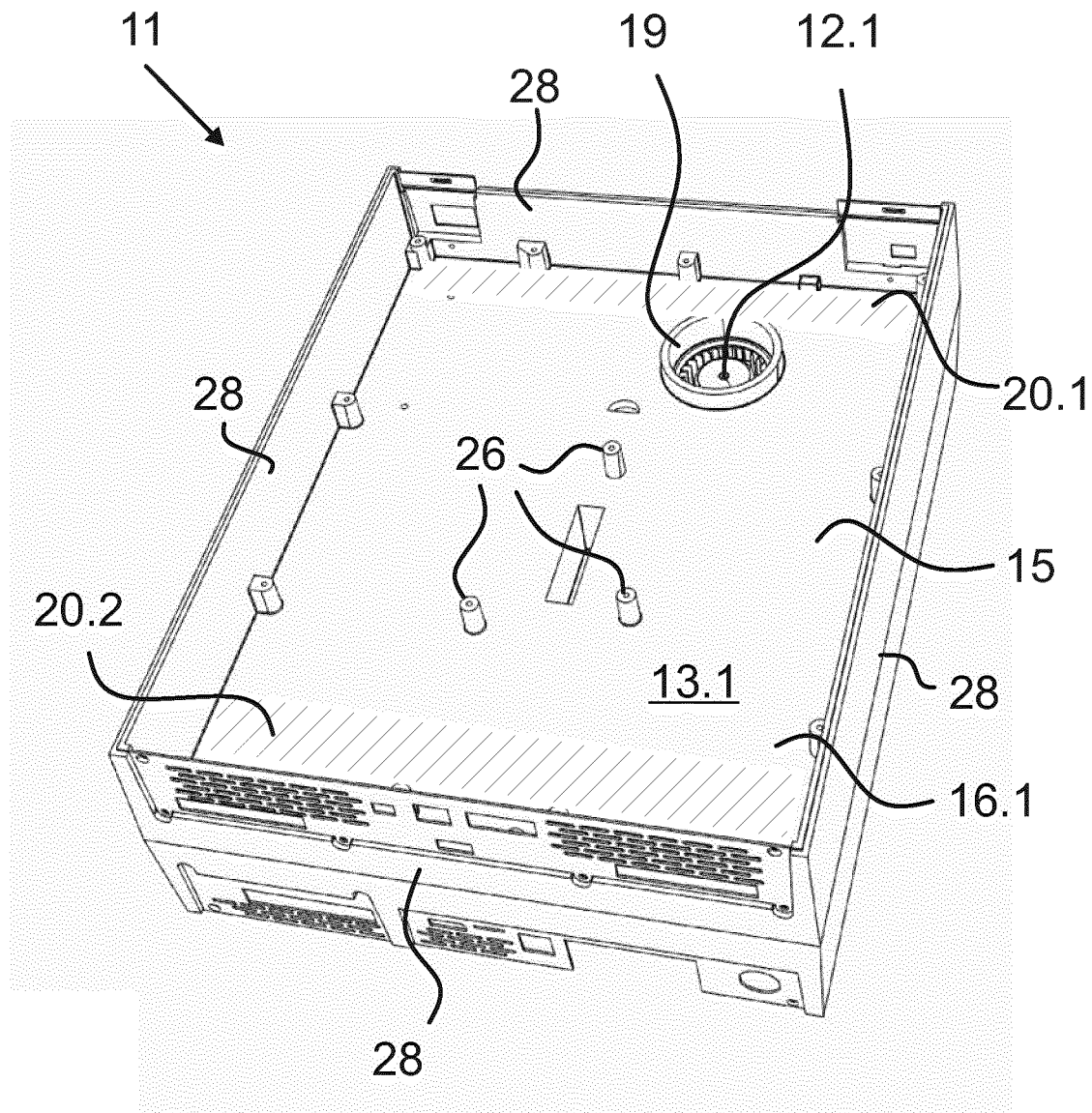
FIG. 2 is a perspective view of a concrete exemplary embodiment of an inventive cooling device in a view on the first receiving space for receiving at least one electrical component, having at least one heat-generating power semiconductor device.
Figure 3:
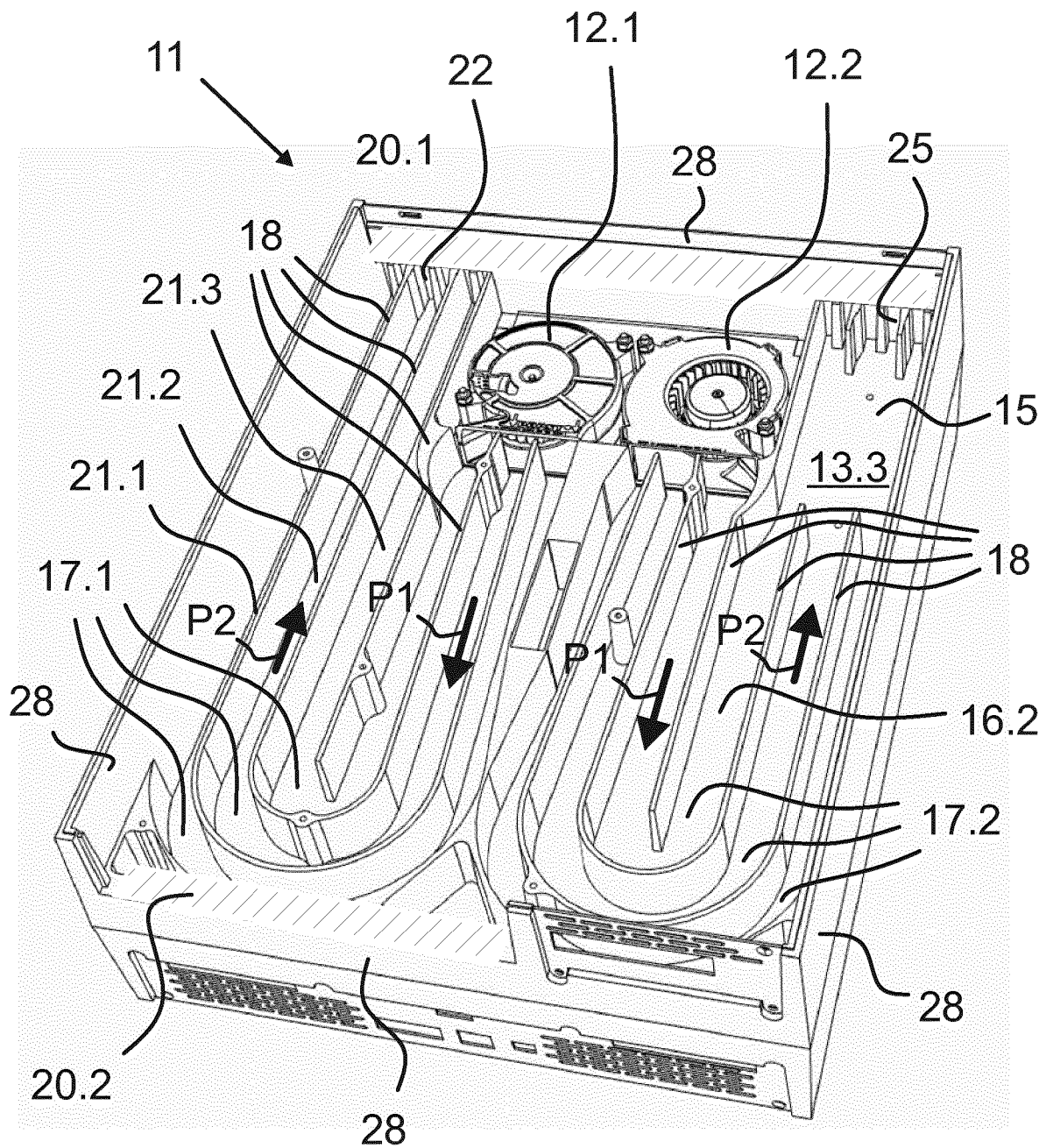
FIG. 3 is a perspective view of the cooling device of FIG. 2 in a view on the intermediate space, with the first lid removed.

The first fan 12.1, as can be seen in particular in FIGS. 2 and 3, is arranged on the cooling air passage opening 19 and thus designed such that the first fan 12.1 draws the cooling air out of the first receiving space 13.1 (FIG. 2) and discharges the same into the intermediate space 13.3 (FIG. 3). The intermediate space 13.3 is arranged between the first receiving space 13.1 and the second receiving space 13.2, as can be seen in particular in the sectional view of FIG. 5. Within the intermediate space 13.3 cooling wall projections 18 are arranged, which are integrally formed with the cooling body wall 15. The first fan 12.1 is formed as a radial fan, which is arranged such that the first radial fan draws the cooling air from the first receiving space 13.1 in the axial direction and discharges the same in the radial direction into the intermediate space 13.3.

As can be seen in particular in FIGS. 2 and 3, the cooling air passage opening 19 is arranged in the region of a first end portion 20.1 of the cooling body wall 15. The cooling wall projections 18 form at least one, in the case of the present exemplary embodiment, three first flow channels 21.1, 21.2 and 21.3, which comprise first inflow channel portions originating from the passage opening 19 and leading (in the direction of the arrow P1) to a second end portion 20.2 of the cooling body wall 15 opposite the first end portion 20.1 of the cooling body wall 15 and first return flow channel portions, originating from the second end portion 20.2 of the cooling body wall 15 and leading back to the first end portion 20.1 of the cooling body wall 15 (in the direction of arrow P2), wherein a first exhaust opening 22 is arranged at the first end portion 20.1, through which opening the cooling air subsequently exits the intermediate space 13.3 or the first flow channels 21.1, 21.2, and 21.3.

Figure 4:
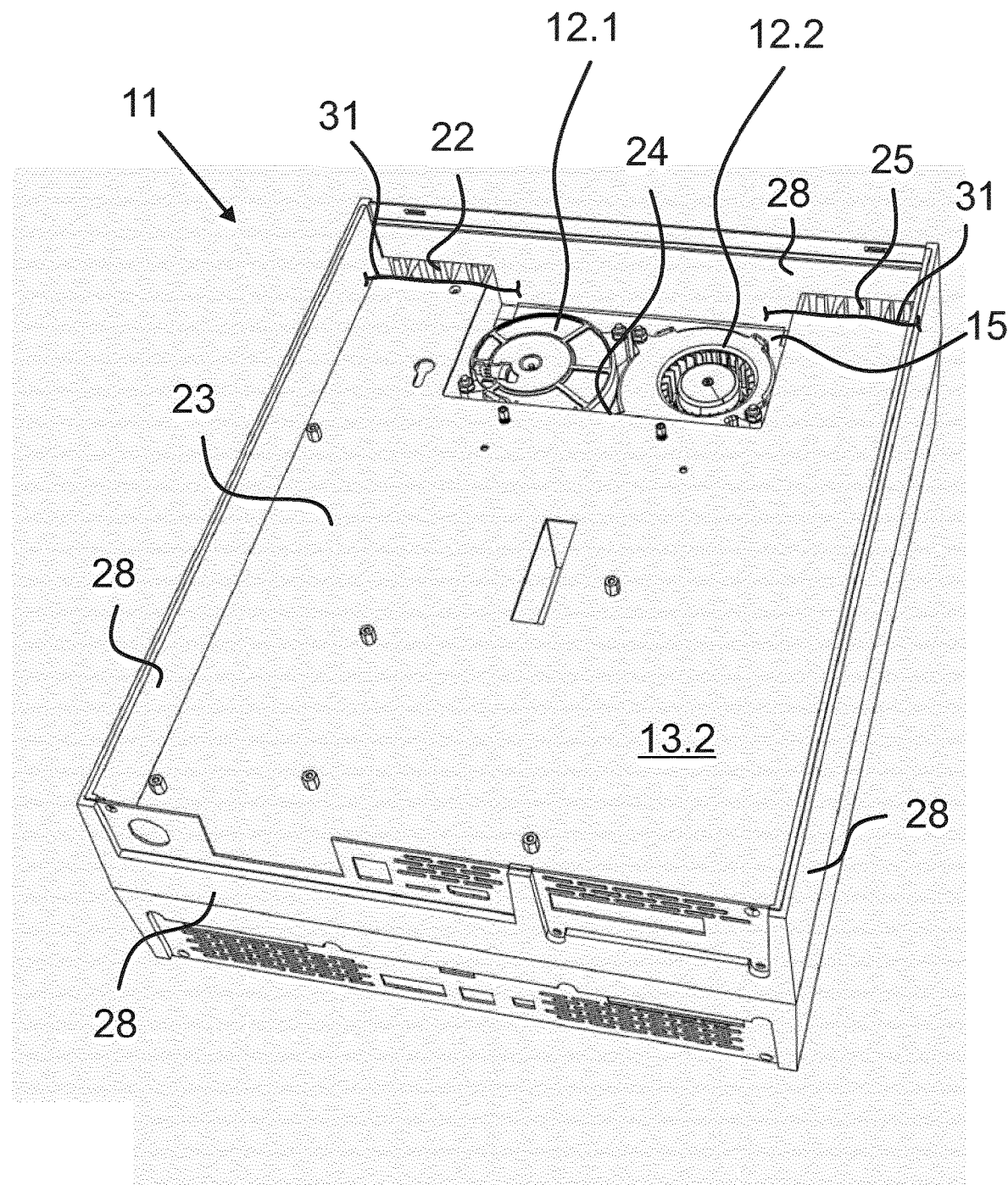
FIG. 4 is a perspective view of the cooling device according to FIG. 2 in a view on the second receiving space, with the first lid attached, such that the intermediate space is fluidically closed.

FIG. 4 shows the cooling device 11 according to FIG. 3, but in contrast to FIG. 2 comprising a first lid 23 which is connected to the cooling body wall 15, which in particular is detachably screwed to the cooling body wall 15 by means of hand tools. The first lid 23 is arranged on the side of the second separating wall surface 16.2 of the cooling body wall 15 and is designed such as to cover the cooling wall projections 18 forming the flow channels 21.1, 21.2 and 21.3, such that the flow channels 21.1, 21.2 and 21.3 are fluidically enclosed both by the second separating wall surface 16.2 and the cooling wall projections 18 and the first lid 23, as can be seen in the sectional view of FIG. 5.

The first lid 23 has a recess 24, which in the present example is open on the edge, and which is designed for conveying a cooling air flow conveyed by the second fan 12.2 of the cooling device 11 from the second receiving space 13.2 through the first lid 23 into the intermediate space 13.3. In the case of the present embodiment, the recess 24 in the first lid 23 is open on the edge, has a rectangular shape and is sized such that it allows access for the assembly both of the first fan 12.1 and the second fan 12.2. In an alternative variant, which is not shown, the recess 24 may however not be open on the edge, i.e. it may be formed with a closed edge contour in the first lid 23; the recess 24 may alternatively be circular or have a circular shape in addition to a rectangular form, and the recess 24 may have such a small size (diameter), that only the second fan 12.2 or its suction opening is recessed.

The first lid 23 is shown in FIG. 4 with broken lines 31, so that the first exhaust opening 22 and the second exhaust opening 25 are visible despite the first lid 23 being closed. However, the first lid 23 actually extends to the upper front wall of the enclosing delimiting side wall 28, so that the first exhaust opening 22 and the second exhaust opening 25 are actually closed by the first lid 23.

The cooling device 11 can accordingly have as a second fan 12.2, which is arranged in the region of the recess 24 of the lid 23 and which can be configured such that the second fan 12.2 draws the cooling air from the second receiving space 13.2 and discharges the same into the intermediate space 13.3.

The second fan 12.2, as shown in the case of the present exemplary embodiment, is designed as a second radial fan, which is arranged such that the second radial fan draws the cooling air from the second receiving space 13.2 in the axial direction and discharges the same in the radial direction into the intermediate space 13.3.

The recess 24 of the lid 23 is arranged in the case of the present embodiment in the region of the first end portion 20.1 of the cooling body wall 15, the cooling wall projections 18 form at least a second flow channel, which comprises a second inflow channel portion originating from the recess 24 of the first lid 23 and which leads to a second end portion 20.2 of the cooling body wall 15 opposite the first end portion 20.1 of the cooling body wall 15 and a second return flow portion originating from the second end portion 20.2 of the cooling body wall 15 and which returns the flow to the first end portion 20.1 of the cooling body wall 15, at which first end portion 20.1 a second exhaust opening 25 is arranged, through which the cooling air exits the intermediate space 13.3.

Figure 5:
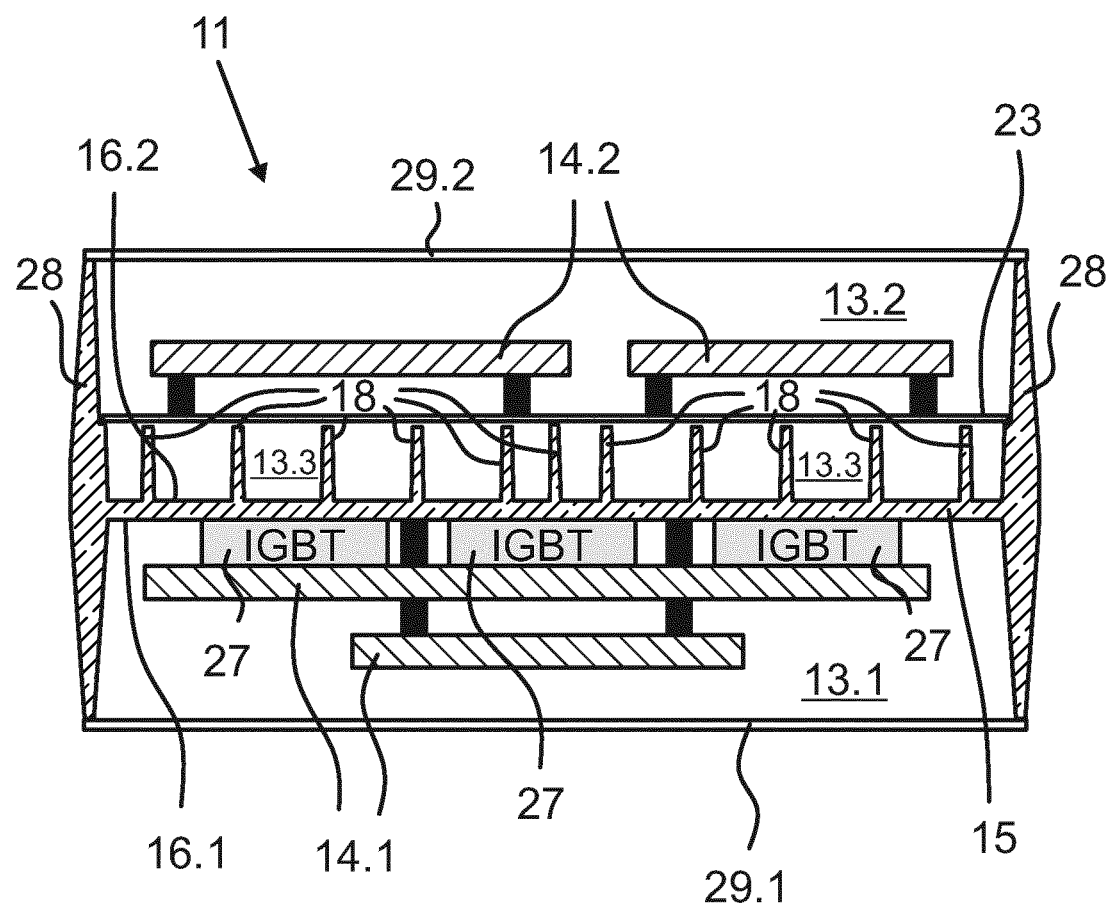
FIG. 5 is a schematic sectional view of the cooling device according to FIG. 2.

The first separating wall surface 16.1 of the cooling body wall 15 facing the first receiving space 13.1 comprises fastening domes 26 which are designed for fastening at least one electrical component 14.1, which component 14.1 comprises at least one power semiconductor component 27, wherein the fastening domes 26 are designed such that in the fastened state of the electrical component 14.1, the at least one power semiconductor component 27 rests, in a heat-transferring way, against the first separating wall surface 16.1 of the cooling body wall 15, as shown in particular in FIG. 5.

In the case of the present embodiment, the cooling body wall 15 is formed as an integral die-cast cooling body.

In addition, in the case of the present exemplary embodiment, the cooling body wall 15 comprises an enveloping delimiting side wall 28 enclosing, in a frame-like manner, the cooling body wall 15, which extends at least substantially perpendicular to the plane of the cooling body wall 15 and which is designed for forming a housing outer wall of a housing of the robot control device 10.

In the case of the present exemplary embodiment, the cooling body wall 15, together with the enveloping delimiting side wall 28 that forms the housing outer wall of the housing of the robot control device 10, is designed as an integral die-cast cooling body.

The enveloping delimiting side wall 28 of the cooling body wall 15 may accordingly form four side walls of a housing of the robot control device 10. In addition, the remaining two sides of the housing, which in particular form a front side and a rear side of the housing, can be closed by a respective separate housing lid 29.1, 29.2.

Figures 6A, 6B:
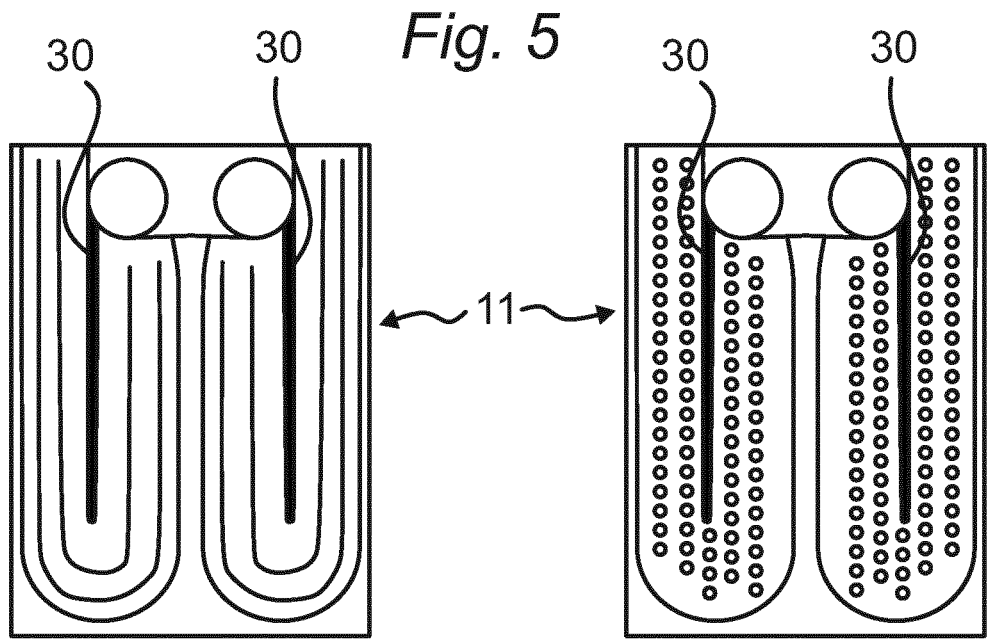
FIG. 6a is a schematic representation of the flow channels, which are delimited by cooling ribs.
FIG. 6b is a schematic representation of the flow channels, which are delimited by cooling domes, cooling fingers or cooling pins.

FIG. 6a shows a first general embodiment of cooling wall projections, which are designed as flat cooling ribs, which extend, i.e. project vertically from the cooling body wall.

The cooling ribs form additional channel walls of the flow channels. The cooling ribs in the case of the present embodiment of FIG. 6a are arranged in an arcuate or U-shape around a central separating wall 30.

FIG. 6b shows a second general embodiment in which the cooling wall projections are only formed by plurality of discrete cooling domes, cooling fingers or cooling pins, which rise, i.e. project perpendicularly from the cooling body wall, and which are shown as circles in the plan view of FIG. 6b.

The cooling wall projections of both embodiments may be arranged on the cooling body wall such that two adjacent cooling ribs or two adjacent rows of cooling domes, cooling fingers or cooling pins form an air flow channel. However, as can be seen in particular in FIG. 6b, these need not be closed throughout. The minimum requirement is a central intermediate wall 30, which clearly separates the inflow channel portion from the return flow channel. Accordingly, the cooling domes, cooling fingers or cooling pins which are spaced apart from one another need not, for example, be arranged in rows as shown in FIG. 6b, but they may be arranged in any desired patterns or distributed randomly.

While the present invention has been illustrated by a description of various embodiments, and while these embodiments have been described in considerable detail, it is not intended to restrict or in any way limit the scope of the appended claims to such detail. The various features shown and described herein may be used alone or in any combination. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit and scope of the general inventive concept.

What is claimed is:

1. A cooling device for cooling electrical components of a robot control device with a cooling air flow generated by at least one fan, the cooling device comprising:
   a first receiving space for first ones of the electrical components of the robot control device;
   a second receiving space for second ones of the electrical components of the robot control device;
   a cooling body wall fluidically separating the first receiving space from the second receiving space, the cooling body wall comprising:
      a first separating wall surface facing the first receiving space,
      a second separating wall surface disposed opposite the first separating wall surface and facing an intermediate space of the cooling body wall, the second separating wall surface including cooling wall projections that form at least one flow channel, the at least one flow channel comprises at least one first flow channel, and
      a cooling air passage opening configured to convey the cooling air flow conveyed by the at least one fan from the first receiving space, through the cooling body wall, and into the intermediate space, the cooling air passage opening is arranged proximate a first end portion of the cooling body wall;
   wherein the at least one first flow channel comprises:
      a first inflow channel portion originating from the cooling air passage opening and leading to a second end portion of the cooling body wall opposite the first end portion of the cooling body wall, and a first return flow channel portion originating from the second end portion of the cooling body wall and returning the cooling air flow to the first end portion of the cooling body wall; and a first exhaust opening at the first end portion through which cooling air exits the intermediate space.

2. The cooling device of claim 1, wherein the at least one fan comprises a first fan arranged proximate the cooling air passage opening; and the first fan configured to draw the cooling air from the first receiving space and discharge the cooling air into the intermediate space.

3. The cooling device of claim 2, wherein the first fan is configured as a radial fan and is arranged such that the first fan draws the cooling air from the first receiving space in an axial direction of the first fan and discharges the cooling air in a radial direction of the first fan into the intermediate space.

4. The cooling device of claim 1, further comprising:

a first lid connected with the cooling body wall and arranged on a side of the second separating wall surface of the cooling body wall; the first lid covering the cooling wall projections that form the at least one flow channel such that the at least one flow channel is fluidically enclosed by the second separating wall surface, the cooling wall projections, and the first lid.

5. The cooling device of claim 4, wherein the first lid comprises a recess configured for conveying the cooling air flow conveyed by the at least one fan from the second receiving space, through the first lid, and into the intermediate space.

6. The cooling device of claim 5, wherein the at least one fan comprises a second fan arranged proximate the recess of the first lid; the second fan configured to draw the cooling air from the second receiving space and discharge the cooling air into the intermediate space.

7. The cooling device of claim 6, wherein the second fan is configured as a radial fan and is arranged such that the second fan draws the cooling air from the second receiving space in an axial direction of the second fan and discharges the cooling air in a radial direction of the second fan into the intermediate space.

8. The cooling device of claim 5 wherein:

the recess of the first lid is arranged in a region of the first end portion of the cooling body wall;

the at least one flow channel further comprises at least one second flow channel that comprises:

a second inflow channel portion originating from the recess of the first lid and leading to a second end portion of the cooling body wall opposite the first end portion of the cooling body wall, and a second return flow channel portion originating from the second end portion of the cooling body wall and returning the cooling air flow to the first end portion of the cooling body wall; and the cooling device further comprises a second exhaust opening at the first end portion through which the cooling air exits the intermediate space.

9. The cooling device of claim 1, further comprising:

a plurality of fastening domes on the first separating wall surface of the cooling body wall and facing the first receiving space; the fastening domes configured for fastening at least one of the electrical components, the at least one of the electrical components comprises at least one power semiconductor component such that, in a fastened state of the at least one of the electrical component, the at least one power semiconductor component rests in a heat-transferring way against the first separating wall surface of the cooling body wall.

10. The cooling device of claim 1, wherein the cooling body wall is configured as an integral die-cast cooling body.

11. The cooling device of claim 1, wherein the cooling body wall comprises an enveloping, delimiting side wall that encloses, in a frame-like manner, the cooling body wall, the side wall extending at least substantially perpendicular to a plane of the cooling body wall and configured to form a housing outer wall of a housing of the robot control device.

12. The cooling device of claim 11, wherein the cooling body wall and the enveloping, delimiting side wall that forms the housing outer wall of the housing of the robot control device are configured as an integral die-cast cooling body.

13. A robot control device comprising a cooling device according to claim 1.

* * * * *